United States Patent
Kawakita et al.

(10) Patent No.: US 7,828,924 B2
(45) Date of Patent: Nov. 9, 2010

(54) INTERMEDIATE MATERIAL FOR MANUFACTURING CIRCUIT BOARD AND METHOD FOR MANUFACTURING CIRCUIT BOARD USING SUCH INTERMEDIATE MATERIAL

(75) Inventors: Yoshihiro Kawakita, Osaka (JP); Toshiaki Takenaka, Kyoto (JP)

(73) Assignee: Panasonic Corporation, Osaka (JP)

(*) Notice: Subject to any disclaimer, the term of this patent is extended or adjusted under 35 U.S.C. 154(b) by 248 days.

(21) Appl. No.: 12/088,203

(22) PCT Filed: Dec. 6, 2006

(86) PCT No.: PCT/JP2006/324342
§ 371 (c)(1), (2), (4) Date: Mar. 26, 2008

(87) PCT Pub. No.: WO2007/069510
PCT Pub. Date: Jun. 21, 2007

(65) Prior Publication Data
US 2009/0114338 A1    May 7, 2009

(30) Foreign Application Priority Data
Dec. 12, 2005  (JP) .............................. 2005-357392

(51) Int. Cl.
| | |
|---|---|
| B29C 65/00 | (2006.01) |
| B29C 63/00 | (2006.01) |
| B32B 37/00 | (2006.01) |
| B32B 38/10 | (2006.01) |
| B32B 38/04 | (2006.01) |
| B32B 15/08 | (2006.01) |
| B32B 9/00 | (2006.01) |
| B32B 33/00 | (2006.01) |
| B31B 1/60 | (2006.01) |
| B65B 33/00 | (2006.01) |
| C09D 5/00 | (2006.01) |

(52) U.S. Cl. .................. 156/247; 156/60; 156/254; 156/344; 156/584; 428/416; 428/901; 428/40.1; 427/154

(58) Field of Classification Search ................... 156/60, 156/247, 254, 344, 584; 428/40.1, 416, 901; 427/154
See application file for complete search history.

(56) References Cited

U.S. PATENT DOCUMENTS
| | | | | |
|---|---|---|---|---|
| 5,481,795 | A | * | 1/1996 | Hatakeyama et al. ......... 29/852 |
| 5,686,172 | A | * | 11/1997 | Ohya et al. ............... 156/89.28 |
| 2004/0214006 | A1 | * | 10/2004 | Hirayama et al. ............ 428/416 |
| 2005/0006139 | A1 | * | 1/2005 | Takenaka et al. ............ 174/256 |

FOREIGN PATENT DOCUMENTS
| | | |
|---|---|---|
| JP | 6-268345 | 9/1994 |
| JP | 2004-221236 | 8/2004 |
| JP | 2004-343086 | 12/2004 |

OTHER PUBLICATIONS
International Search Report issued Jan. 9, 2007 in the International (PCT) Application of which the present application is the U.S. National Stage.

* cited by examiner

Primary Examiner—Khanh Nguyen
Assistant Examiner—Matthew Hoover
(74) Attorney, Agent, or Firm—Wenderoth, Lind & Ponack, L.L.P.

(57) ABSTRACT

An intermediate material which is adapted to manufacture a circuit board includes a prepreg sheet having a through-hole provided therein, a first film provided on a surface of the prepreg sheet and having a first hole communicating with the through-hole, a second film provided on another surface of the prepreg sheet and having a second hole communicating with the through-hole, and a conductive paste filling the though-hole, the first hole, and the second hole. The thickness $t_1$ of the prepreg sheet, the minimum diameter $r_{min}$ of the through-hole, the thickness $t_{f1}$ of the first film, the diameter $r_{f1}$ of the first hole, the thickness $t_{f2}$ of the second film, the diameter $r_{f2}$ of the second hole satisfy a relation: $r_{f1}/t_{f1} \geq 3$, $r_{f2}/t_{f2} \geq 3$, and $r_{min}/(t_1+t_{f1}+t_{f2}) \leq 1.5$. This intermediate material provides a circuit board having a fine via-conductor connected to a metal foil securely and stably.

20 Claims, 15 Drawing Sheets

Fig. 4

| Sample No. | Thickness $t_1$ of Prepreg Sheet 11 (μm) | Thicknesses $t_{f1}$ and $t_{f2}$ of Organic Films 12A and 12B (μm) | Diameters $r_{f1}$ and $r_{f2}$ of Holes 112A and 112B (μm) | Minimum Diameter $r_{min}$ of Hole 13 (μm) | Ratio R1 | Ratio R2 | Resistance |
|---|---|---|---|---|---|---|---|
| 1 | 60 | 10 | 40 | 30 | 4.0 | 0.38 | ≤10mΩ |
| 2 | 60 | 20 | 40 | 30 | 2.0 | 0.30 | >10mΩ |
| 3 | 60 | 20 | 60 | 50 | 3.0 | 0.50 | ≤10mΩ |
| 4 | 60 | 20 | 100 | 90 | 5.0 | 0.90 | ≤10mΩ |
| 5 | 60 | 20 | 160 | 150 | 8.0 | 1.50 | ≤10mΩ |
| 6 | 60 | 20 | 180 | 170 | 9.0 | 1.70 | >10mΩ |
| 7 | 60 | 30 | 180 | 170 | 6.0 | 1.42 | ≤10mΩ |

INTERMEDIATE MATERIAL FOR MANUFACTURING CIRCUIT BOARD AND METHOD FOR MANUFACTURING CIRCUIT BOARD USING SUCH INTERMEDIATE MATERIAL

TECHNICAL FIELD

The present invention relates to an intermediate material for manufacturing a circuit board for use in various electronic apparatuses and to a method of manufacturing a circuit board with the intermediate material.

BACKGROUND ART

Electronic apparatuses have had small sizes and large densities, and accordingly, circuit boards have a large number of circuits and components mounted thereon at high densities.

FIGS. 7A to 7F are cross sectional views of a conventional circuit board 501 for illustrating a method of manufacturing the board 501.

FIG. 7A is a cross sectional view of an intermediate material 21 for manufacturing the circuit board. The intermediate material 21 includes a prepreg sheet 121 and organic films 22 bonded to both surfaces 121A and 121B of the prepreg sheet 121 by a laminating method with, for example, a heat roller. The prepreg sheet 121 is made mainly of glass fiber woven cloth and thermoset resin, such as epoxy resin, impregnated in the glass fiber woven cloth. The thermoset resin is maintained at B stage by, for example, a drying method.

Then, as shown in FIG. 7B, a though-hole 23 is provided in the intermediate material 21 by a processing technique, such as laser piecing. The intermediate material 21 is then placed on a porous sheet and sucked through the porous sheet. While the intermediate material 21 is sucked, the though-hole 23 is filled with a conductive paste 24 by, for example, printing. Then, the intermediate material 21 is removed from the porous sheet, and has the though-hole 23 filled with the conductive paste, as shown in FIG. 7C. The conductive paste 24 is prepared by mixing and milling conductive particles, thermoset resin, hardener, and solving agent.

Then, as shown in FIG. 7D, the organic film 22 is peeled off to provide the prepreg sheet 121 having the conductive paste 24 protruding from the surfaces 121A and 121B. Copper foils 25 are placed on the surfaces 121A and 121B of the prepreg sheet 121.

Then, while being sandwiched between metal plates, such as SUS plates, the prepreg sheet 121 are heated and pressed, thereby curing the intermediate material 21 so as to provide the cured board 122. The conductive paste 24 is compressed to provide a via-conductor 124 electrically connected with the copper foils 25, as shown in FIG. 7E.

The copper foils 25 are patterned by a photolithographic method to provide circuit wiring layers 26, thus providing a circuit board 501 shown in FIG. 7F. If required, the circuit wiring layers 26 and the cured board 122 may be coated with solder resists. Alternatively, the circuit wiring layers 26 may be subjected to surface processing, such as plating.

FIGS. 8A to 8D are cross sectional views of a conventional multi-layer circuit board 503 for illustrating a method of manufacturing board 503.

FIG. 8A illustrates a core board 31, the circuit board 501 manufactured by the processes shown in FIGS. 7A to 7F. The core board 31 includes a cured board 132, via-conductors 133, and circuit wiring layers 32 corresponding to the cured board 122, the via-conductors 124, and the circuit wiring layers 26 shown in FIG. 7F, respectively.

As shown in FIG. 8B, prepreg sheets 36 and a conductive paste 35 similar to the prepreg sheets 121 and the conductive paste 24 shown in FIG. 7D are positioned on both surfaces of the core board 31. Then, copper foils 34 are placed on the prepreg sheets 36, and heated and pressed. This operation allows the prepreg sheets 36 to be cured boards 136, thereby providing a cured laminated structure 502 shown in FIG. 8C.

Then, the copper foils 34 are patterned by a photolithographic method to provide circuit wiring layers 37, thereby providing the multi-layer circuit board 503. If required, solder resists may be provided on the circuit wiring layers 37 and the cured board 136. Alternatively, the circuit wiring layers 37 may be subjected to surface processing, such as plating.

The processes shown in FIGS. 8A to 8D may be repeated for manufacturing a further multi-layer circuit board by using the multi-layer circuit board 37 acting as a core board.

FIGS. 9A to 9C are cross sectional views of the intermediate material filled with the conductive paste shown in FIG. 7C for illustrating a method of the intermediate material.

Similar to the prepreg sheet 121 shown in FIG. 7C, organic films 41 are bonded to surfaces 43A and 43b of the prepreg sheet 43 having though-hole 44 provided therein, as shown in FIG. 9A. The prepreg sheet 43 bonded to the organic films 41 is sucked to a porous sheet 45 while the though-hole 44 is filled with a conductive paste 42 by the suction.

Then, as shown in FIGS. 9B and 9C, the porous sheet 45 is removed, and the organic films 41 are peeled off from the prepreg sheet 43. Then, the conductive paste 42 has portions 42A and 42B protruding from surfaces 43A and 43B of the prepreg sheet 43 by the thickness of the organic film 41.

In order to mount components at high density, distances between terminals of the components are reduced, and cause the diameters of the lands on the circuit wiring layers. This reduces the diameter of each via-conductor.

The high-density mounting decreases sizes of the circuit wiring layer and the via-conductors. The circuit boards 501 and 503 manufactured by the conventional method, upon being thinner, may have large resistances at the joining between the via-conductor and the circuit wiring layer. This will be explained in more detail below.

FIGS. 10A to 10C are cross sectional views of another intermediate material 153 filled with the conductive paste for illustrating a method of the board 153.

Similar to the prepreg sheet 43 shown in FIG. 9A, organic films 51A and 51B are bonded to surfaces 53A and 53B of a prepreg sheet 53 of the material 153, respectively, and though-hole 54 is provided in the prepreg sheet 53, as shown in FIG. 10A. The prepreg sheet 53 with the organic films 51A and 51B is sucked to a porous sheet 55 while the though-hole 54 is filled with the conductive paste 52 by the suction.

Then, as shown in FIG. 10B, the porous sheet 55 is removed. Then, the organic films 51A and 51B are peeled off from the prepreg sheet 53, as shown in FIG. 10C. This allows the conductive paste 52 to have a portion 52A protruding from the surface 53A of the prepreg sheet 53 by the thickness of the organic film 51A. However, a portion 56 of the conductive paste 52 may be separated when the organic film 51B is peeled off from the prepreg sheet 53. This causes the total amount of the conductive paste 52 to be smaller than the amount of the paste originally filling the though-hole 54. The resistance at the joining between the via-conductor and the copper foil on the circuit board accordingly increases, thereby causing connection fault.

FIGS. 11A to 11C are cross sectional views of a further intermediate material 163 filled with a conductive paste for illustrating a method of manufacturing the material 163.

Similar to the prepreg sheet 43 shown in FIG. 9A, organic films 61 are bonded to both surfaces of a prepreg sheet 63 of the material 163 having a though-hole 64 provided therein, as shown in FIG. 11A. The prepreg sheet 63 with the organic films 61 is sucked to a porous sheet 65, while the though-hole 64 is filled with a conductive paste 62 by the suction.

Then, as shown in FIG. 11B, a portion 66 of the conductive paste 62 may be separated from the though-hole 64 when the intermediate material 163 is removed from the porous sheet 65. In this case, the though-hole 64 is not filled with the conductive paste 62, preventing the circuit board from having a via-conductor to be connected the copper foil.

SUMMARY OF THE INVENTION

An intermediate material which is adapted to manufacture a circuit board includes a prepreg sheet having a through-hole provided therein, a first film provided on a surface of the prepreg sheet and having a first hole communicating with the through-hole, a second film provided on another surface of the prepreg sheet and having a second hole communicating with the through-hole, and a conductive paste filling the though-hole, the first hole, and the second hole. The thickness $t_1$ of the prepreg sheet, the minimum diameter $r_{min}$ of the through-hole, the thickness $t_{f1}$ of the first film, the diameter $r_{f1}$ of the first hole, the thickness $t_{f2}$ of the second film, the diameter $r_{f2}$ of the second hole satisfy a relation: $r_{f1}/t_{f1} \geq 3$, $r_{f2}/t_{f2} \geq 3$, and $r_{min}/(t_1+t_{f1}+t_{f2}) \leq 1.5$.

This intermediate material provides a circuit board having a fine via-conductor connected to a metal foil securely and stably.

BRIEF DESCRIPTION OF THE DRAWINGS

FIG. 4 illustrates evaluation results of samples of the circuit board according to the embodiment.

REFERENCE NUMERALS

11 Prepreg Sheet
12A Organic Film (First Organic Film)
12B Organic Film (Second Organic Film)
13 Through-Hole 15 Conductive Paste
112A Hole (First Hole)
112B Hole (Second Hole)
125A Metal Foil (First Metal Foil)
125B Metal Foil (Second Metal Foil)
211 Reinforcing Material
311 Resin
412A Removable Layer (First Removable Layer)
412B Removable Layer (Second Removable Layer)
531 Core Board
701 Metal Plate
1001 Intermediate Material

DETAIL DESCRIPTION OF THE INVENTION

Figure 1:
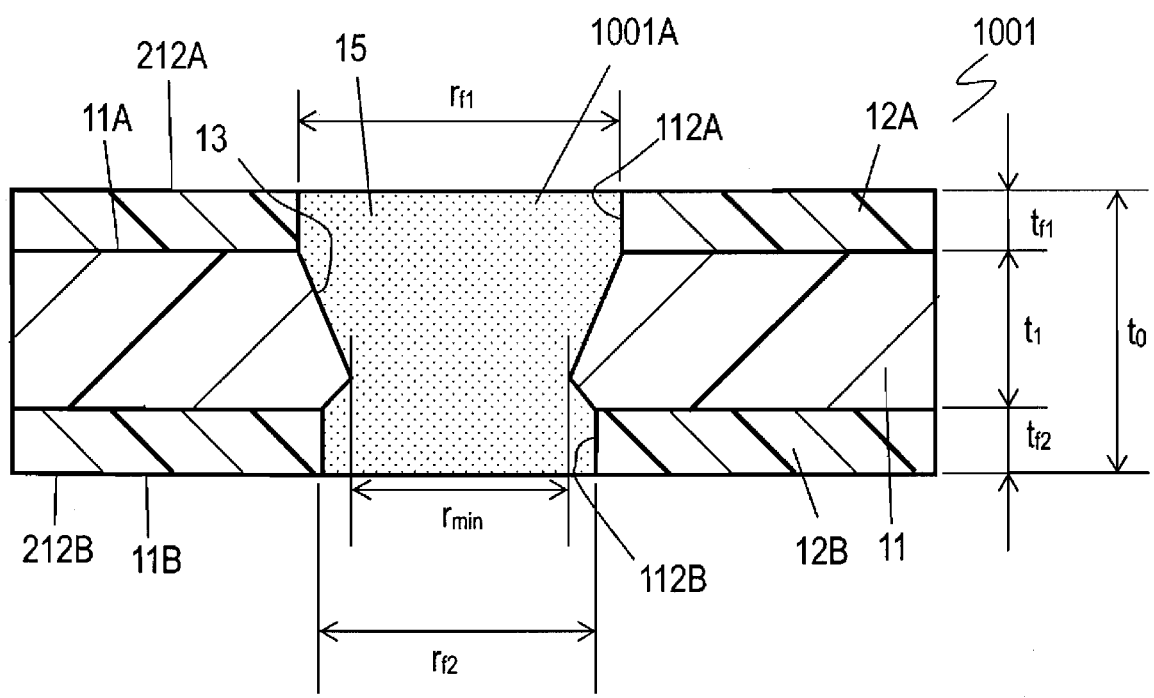
FIG. 1 is a cross sectional view of an intermediate material according to an exemplary embodiment of the present invention.

FIG. 1 is a cross sectional view of an intermediate material 1001 for manufacturing a circuit board according to an exemplary embodiment of the present invention. The intermediate material 1001 includes a prepreg sheet 11 and organic films 12A and 12B bonded to both surfaces 11A and 11B of the prepreg sheet 11. The prepreg sheet 11 has a though-hole 13 therein communicating with the surfaces 11A and 11B of the prepreg sheet 11. The organic films 12A and 12B have holes 112A and 112B provided therein at both openings of the though-hole 13, respectively. More specifically, the intermediate material 1001 has a though-hole 1001A provided therein. The through-hole 1001A includes the though-hole 13 and the holes 112A and 112B communicating with the though-hole 13. The though-hole 1001A is filled with a conductive paste 15. That is, the conductive paste 15 fills the holes 112A and 112B and the though-hole 13.

The organic films 12A and 12B have thicknesses $t_{f1}$ and $t_{f2}$, respectively. The holes 112A and 112B have diameters $r_{f1}$ and $r_{f2}$, respectively. The prepreg sheet 11 has a thickness $t_1$. The though-hole 13 has a diameter $r_{min}$. The thickness $t_0$ of the intermediate material 1001 is expressed as follows.

$$t_0 = t_1 + t_{f1} + t_{f2}$$

Figure 10A:
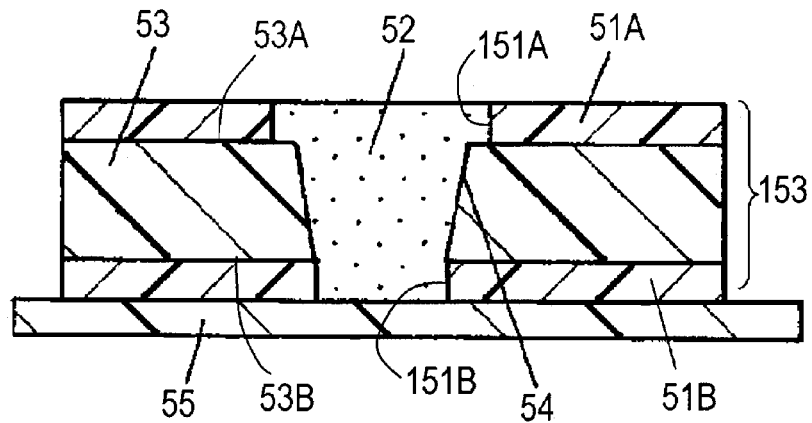
FIG. 10A is a cross sectional view of another conventional circuit board for illustrating the method of manufacturing the board.
Figure 10B:
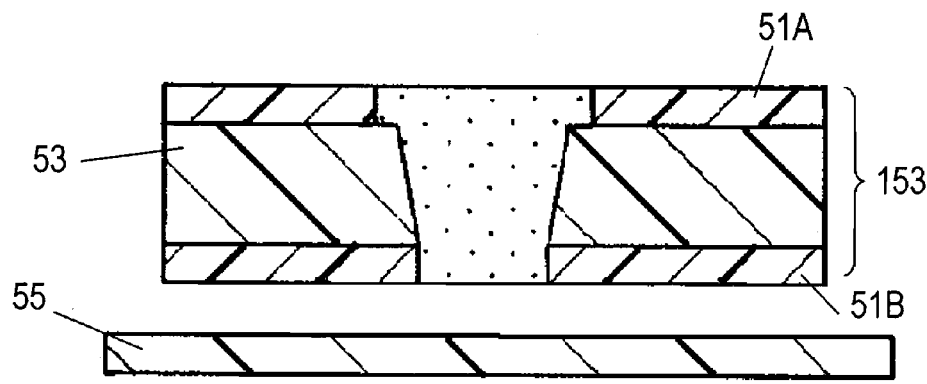
FIG. 10B is a cross sectional view of another conventional circuit board for illustrating the method of manufacturing the board.
Figure 10C:
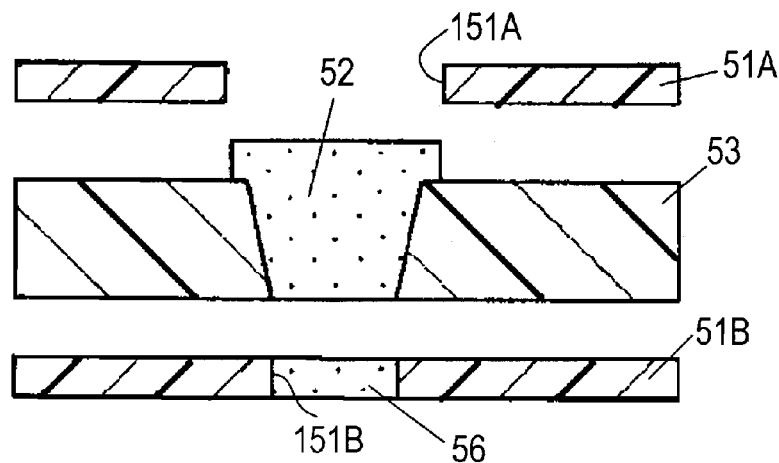
FIG. 10C is a cross sectional view of another conventional circuit board for illustrating the method of manufacturing the board.

According to this embodiment, $r_{f1}/t_{f1}$ and $r_{f2}/t_{f2}$ is not smaller than 3 while $r_{min}/t_0$ is not greater than 1.5. The intermediate material 1001 satisfying this condition prevents the conductive paste 15 from having a portion of the conductive paste 15 taken together with the organic films 12A and 12B, as shown in FIG. 10C, and prevents the conductive paste 15 from removing while being attached to the porous sheet 65, as shown in FIG. 11C.

The thicknesses $t_{f1}$ and $t_{f2}$ of the organic films 12A and 12B are not smaller than 5 μm and not greater than 30 μm. The thicknesses $t_{f1}$ and $t_{f2}$ smaller than 5 μm may cause the organic films 12A and 12B to break off when removing from the prepreg sheet 11. The thicknesses $t_{f1}$ and $t_{f2}$ greater than 30 μm may cause a portion of the conductive paste 15 to remove together with the organic films 12A and 12B, as shown in FIG. 10C.

Figure 2:
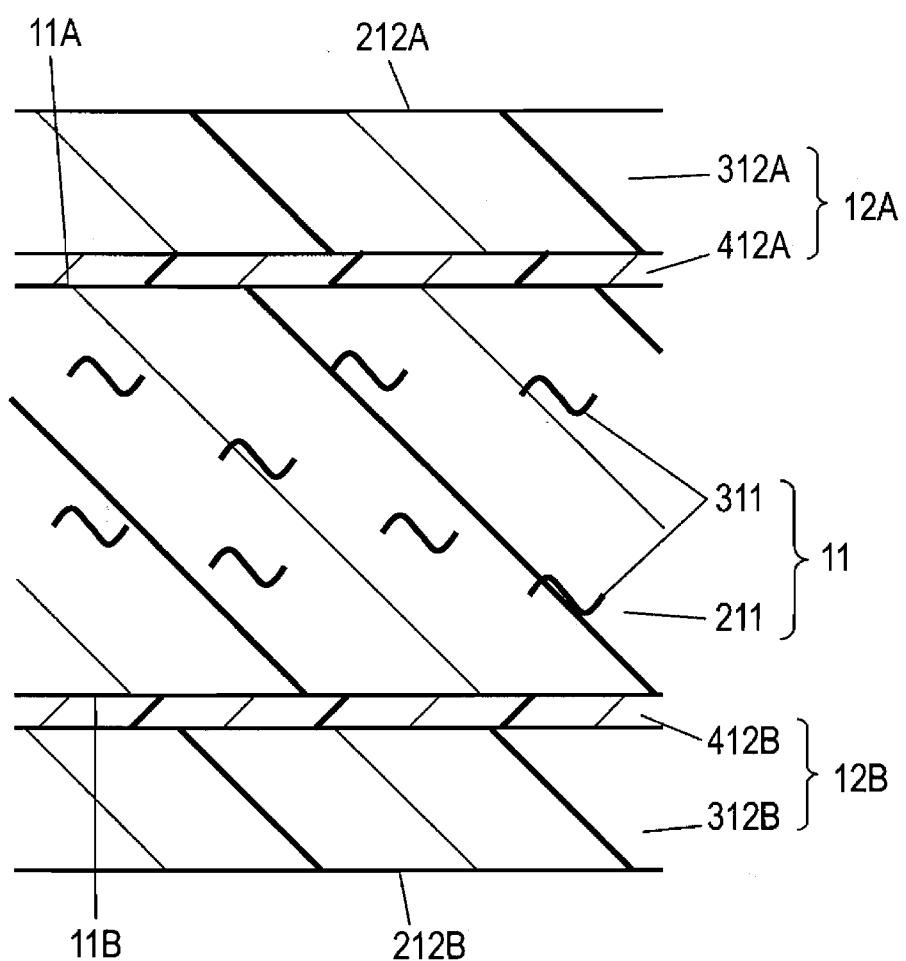
FIG. 2 is an enlarged cross sectional view of the intermediate material according to the embodiment.

FIG. 2 is an enlarged cross sectional view of the intermediate material 1001. The prepreg sheet 11 includes a reinforcing material 211 made of glass fiber woven cloth and a thermoset resin 311, such as epoxy resin, impregnated in the reinforcing material 211. The thermoset resin 311 is at B stage by, for example, drying. The organic film 12A includes a core material 312A made of resin film, such as polyethylene terephthalate film or polyethylene terenaphthalate film, and a removable-agent layer 412A provided on the core material 312A. The removable-agent layer 412A may be made of thermoset resin. The removable-agent layer 412A allows the organic film 12A to be easily removed from the prepreg sheet 11. The organic film 12A is provided on the surface 11A of the prepreg sheet 11 while the removable-agent layer 412A contacts the surface 11A of the prepreg sheet 11. Similarly, the organic film 12B includes a core material 312B made of resin film, such as polyethylene terephthalate film or polyethylene terenaphthalate film, and a removable-agent layer 412B provided on the core material 312B. The removable-agent layer 412B may be made of thermoset resin. The removable-agent layer 412B allows the organic film 12B to be easily removed from the prepreg sheet 11. The organic film 12B is provided on the surface 11B of the prepreg sheet 11 while the removable-agent layer 412B contacts the surface 11B of the prepreg sheet 11.

The thermoset resin 311 of the prepreg sheet 11 has a softening temperature preferably lower than a reaction-starting temperature of the conductive paste 15. During the heating and forming of the prepreg sheet 11, the conductive paste 15 filling the though-hole 13 is primarily compressed while the prepreg sheet 11 is softened. Then, the conductive paste 15 is cured. The via-conductor made of the cured conductive paste 15 is connected securely with the circuit wiring layer.

The conductive paste 15 is made of a mixture containing conductive particles and a thermoset resin. The conductive particles may be preferably made of metal, such as gold, copper, silver, indium, solder, or alloy thereof. Alternatively, the conductive particles may be spherical particles coated with the above metal. The conductive paste 15 is softened at a room temperature. The thermoset resin of the conductive paste 15 preferably contains mainly liquid epoxy resin. This material allows the conductive paste 15 to fill at high productivity, and securely connects the via-conductor electrically with the circuit wiring layer.

In the case that the reinforcing material 211 of the prepreg sheet 11 is made of inorganic material, the material 211 may be preferably made of glass fiber woven cloth, glass fiber unwoven cloth, or combination thereof. The reinforcing material 211 made of this material provides a rigid, inexpensive circuit board.

The thermoset resin 311 of the prepreg sheet 11 preferably contains 30 to 80 phr of inorganic filler. The content of the inorganic filler can be adjusted so as to effectively control the fluidity of the thermoset resin 311 during the heating and forming of the prepreg sheet 11, hence connecting the via-conductor securely with the circuit wiring layer. The inorganic filler may be made of non-conductive, inorganic material, such as silica, aluminum hydroxide, aluminum nitride, or alumina, and may preferably have an arbitrary shape having a diameter not greater than 10 μm.

In the case that the reinforcing material 211 of the prepreg sheet 11 is made of organic material, the material 211 may be made of at least one of organic film, such as polyimide or aramid film, aramid woven cloth, or aramid unwoven cloth, providing a light circuit board used as a high-frequency circuit board. In this case, the thermoset resin 311 of the prepreg sheet 11 may preferably contain mainly epoxy resin for cost performance. Alternatively, the resin 311 may be made mainly of polyimide resin, polyester resin, or cyanate ester resin.

A method of manufacturing a circuit board 1004 with using the intermediate material 1001 will be described below. FIGS. 3A to 3H are cross sectional views of the intermediate material 1001 for illustrating the method of manufacturing the circuit board 1004 with the intermediate material 1001.

Figure 3A:
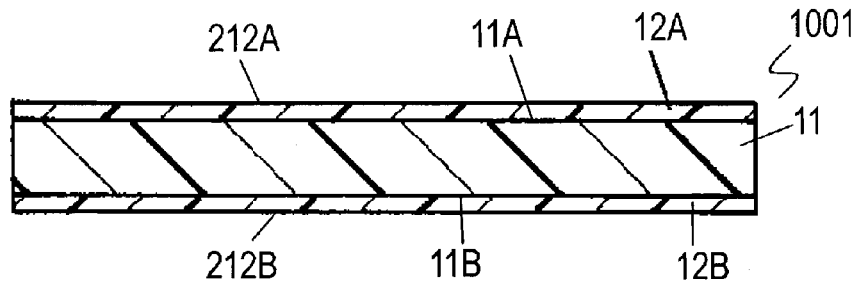
FIG. 3A is a cross sectional view of a circuit board for illustrating a method of manufacturing the circuit board according to the embodiment.

A glass fiber woven cloth having a square shape of 250 mm by 250 mm and having a thickness of about 40 μm is prepared and impregnated with 70 wt % of thermoset epoxy resin. The thermoset epoxy resin has a softening temperature of 70° C. and contains 50 phr of aluminum hydroxide particles having diameters ranging from 2 μm to 8 μm in the diameter. The resin is semi-cured so as to provide a prepreg sheet 11 having a thickness of 60 μm. Polyethylene terephthalate (PET) films 12A and 12B having a thickness ranging from 10 μm to 30 μm coated with removable-agent are prepared. As shown in FIG. 3A, the organic films 12A and 12B made of PET are bonded to both surfaces 11A and 11B of the prepreg sheet 11 by heat pressing with a roll laminator heated to 100° C., respectively, thereby providing the intermediate material 1001 allowing surfaces 212A and 212B of the organic films 12A and 12B to expose.

Figure 3B:
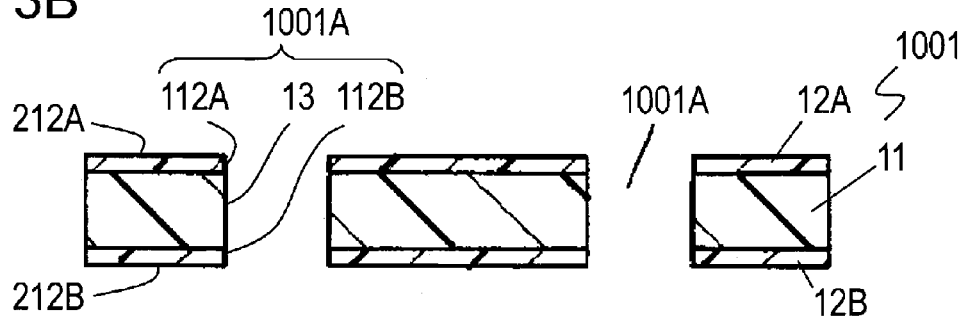
FIG. 3B is a cross sectional view of the circuit board for illustrating the method of manufacturing the circuit board according to the embodiment.
Figure 3C:
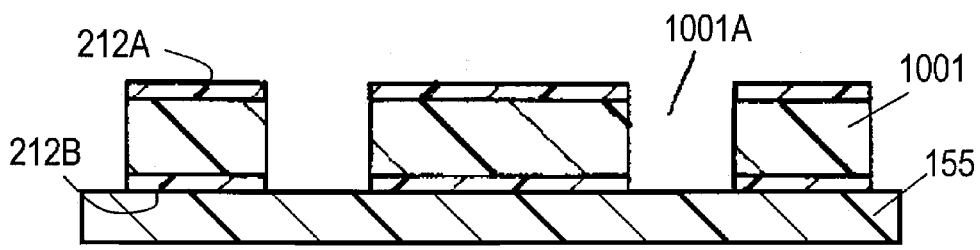
FIG. 3C is a cross sectional view of the circuit board for illustrating the method of manufacturing the circuit board according to the embodiment.

Then, as shown in FIG. 3B, though-hole 1001A is provided in the prepreg sheet 11 having the organic films 12A and 12B bonded thereto by carbon dioxide laser. The through-hole 1001A communicates with the surfaces 212A and 212B. As shown in FIG. 1, the though-hole 1001A includes the though-hole 13 which extends through the prepreg sheet 11 between the surfaces 11A and 11B and though-holes 112A, 112B which extends through the organic films 12A and 12B, respectively. The diameters of the though-holes 112A and 112B range from 50 μm to 180 μm while the minimum diameter of the though-hole 13 ranges from 40 μm to 170 μm. Then, as shown in FIG. 3C, the intermediate material 1001 is placed on a porous sheet 155 made of porous material, such as cellulose, while the surface 212B contacts the porous sheet 155, and is sucked through the porous sheet 155 by a vacuum pump.

Figure 3D:
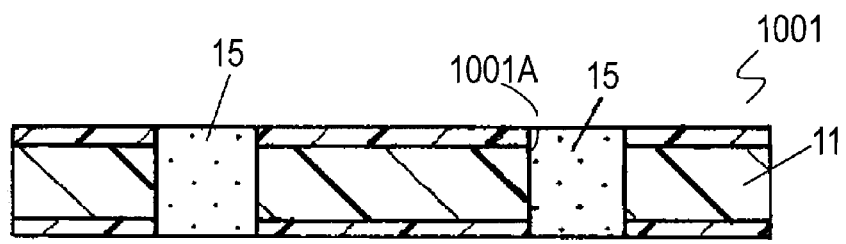
FIG. 3D is a cross sectional view of the circuit board for illustrating the method of manufacturing the circuit board according to the embodiment.

While the intermediate material 1001 is sucked by the vacuum pump, the though-hole 1001A is filled by squeezing with the conductive paste 15. Then, the porous sheet 155 is removed off, thereby providing the intermediate material 1001 having the though-holes 1001A filled with the conductive paste 15, as shown in FIG. 3D.

The conductive paste 15 mainly contains a mixture of thermoset epoxy resin including no solvent and copper particles, and further includes a curing agent of acid anhydride type. More particularly, 85% by weight of the copper particles, 12.5% by weight of the thermoset epoxy resin, and 2.5% by weight of the curing agent are mixed and milled with a three-roll mill to provide the conductive paste 15. The reaction-starting temperature of the conductive paste 15 at which the paste 15 starts curing is 120° C.

Figure 3E:
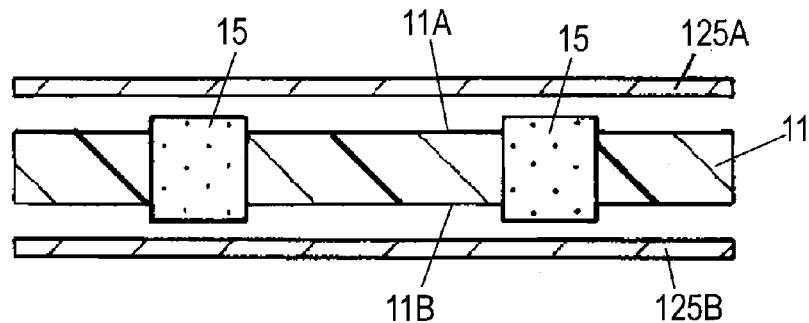
FIG. 3E is a cross sectional view of the circuit board for illustrating the method of manufacturing the circuit board according to the embodiment.
Figure 3F:
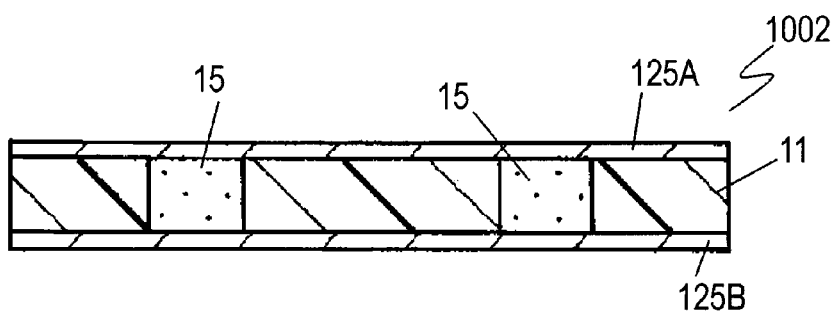
FIG. 3F is a cross sectional view of the circuit board for illustrating the method of manufacturing the circuit board according to the embodiment.
Figure 3G:
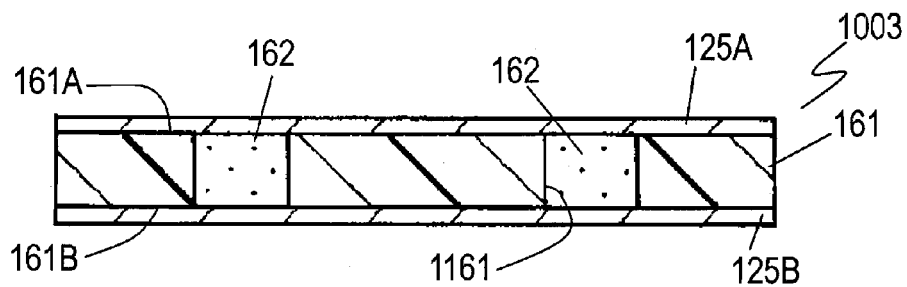
FIG. 3G is a cross sectional view of the circuit board for illustrating the method of manufacturing the circuit board according to the embodiment.

Then, the organic films 12A and 12B are removed from the intermediate material 1001 so that the conductive paste 15 protrudes from surfaces 11A and 11B of the prepreg sheet 11. Then, as shown in FIG. 3E, metal foils 125A and 125B, such as copper foils, having thicknesses of 14 μm are placed on the surfaces 11A and 11B of the prepreg sheet 11, respectively, thus providing a laminated body 1002 shown in FIG. 3F. According to this embodiment, the metal foil 125A has a weight of 128 g/cm$^2$.

Then, the laminated body 1002 is placed on a SUS 304 plate having a thickness of about 1 mm, and is placed on a plate. Then, the laminated body 1002 is sandwiched between metal plates, such as SUS 304 plates, and is put in a vacuum heat-pressing machine to be pressed and heated to a temperature for curing the thermoset resin 311 (FIG. 2), providing a circuit board 1003 shown in FIG. 3G. While the prepreg sheet 11 is softened during the heating and pressing, the conductive paste 15 shrinks due to the pressing. The circuit board 1003 includes a cured board 161 provided by curing the prepreg sheet 11, the metal foils 125A and 125B contacting surfaces 161A and 161B of the cured board 161, and via-conductor 162 provided by during the conductive paste 15. The via-conductor 162 is electrically connected with the metal foils 125A and 125B, and is provided in the though-hole 1161 communicating with the surfaces 161A and 161B of the cured board 161.

Figure 5:
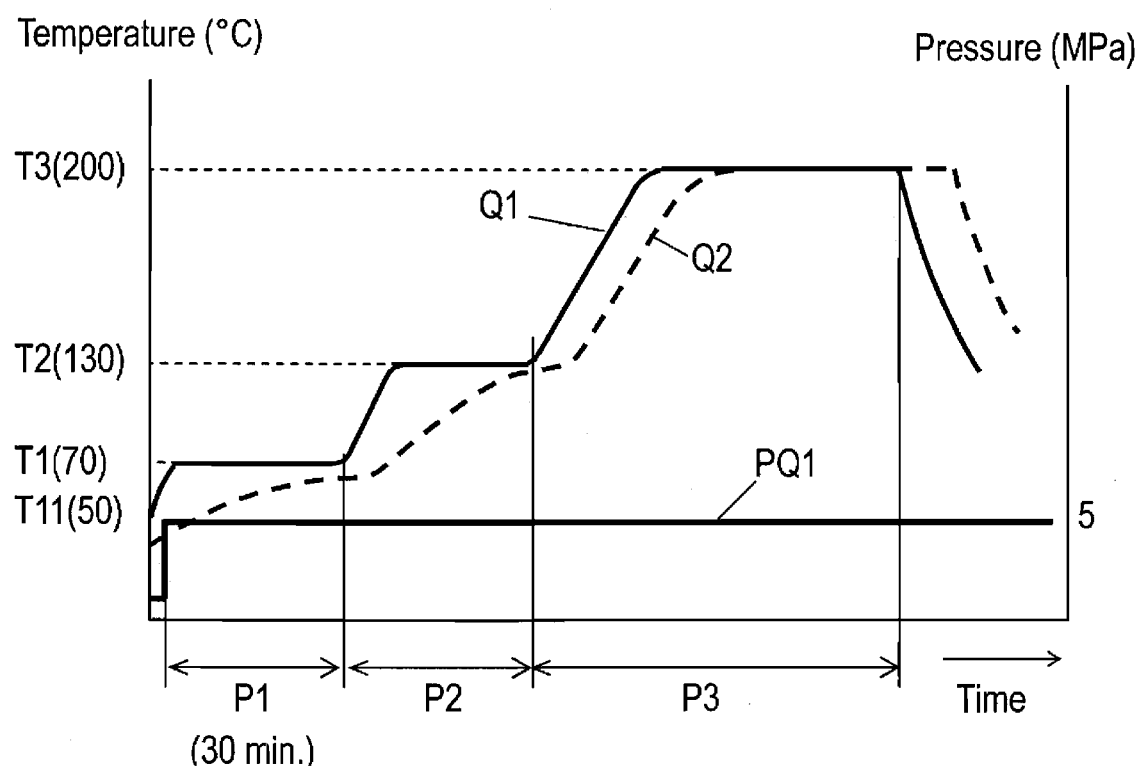
FIG. 5 illustrates a temperature profile and a pressure profile for forming the circuit board.

FIG. 5 illustrates profiles of temperature Q1 and pressure PQ1 for heating and pressing the laminated body 1002 of the intermediate material so as to provide the circuit board 1003. The softening temperature of the thermoset resin 311 of the prepreg sheet 11 is lower than the reaction-starting temperature of the conductive paste 15 at which the conductive paste 15 starts curing. The prepreg sheet 11 is at B stage, i.e., is semi-cured. While being heated, the sheet 11 is softened and then cured.

The laminated body 1002 is put in the vacuum pressing machine. The temperature of the pressing machine is raised from a temperature T11 (50° C.) to a softening temperature T1 (70° C.) for softening the resin 311, and is maintained for a predetermined period P1 of time, for example, thirty minutes. Upon the temperature reaching the temperature T1, the pressing machine applies a pressure of 5 MPa to the laminated body 1002. During the period P1, the conductive paste 15 is not cured while the resin 311 is softened. Hence, the conductive paste 15 is efficiently compressed by the applied pressure.

After the period P1 for which the temperature is maintained at the temperature T1, the temperature of the vacuum pressing machine is raised by a rising speed of 5° C./min and maintaining to a temperature T2 (130° C.) for a period P2 of time. The temperature T2 is higher than the reaction-starting temperature of the conductive paste 15 and lower than the curing temperature of the resin 311. The temperature T2 cures the conductive paste the period P2 but does not cure the resin 311 for the period P2. Since the resin 311 is not cured for the period P2, the prepreg sheet 11 can be shaped reliably. While the resin 311 of the prepreg sheet 11 is softened for the period P1 before the period P2, the conductive paste 15 is sufficiently compressed before being cured. This operation increases the density of the conductive particles in the via-conductor 162 provided by curing the conductive paste 15, accordingly allowing the via-conductor 162 to have a large conductivity and to be electrically connected reliably with the metal foils 125A and 125B.

After the period P2 for which the temperature is maintained at the temperature T2, the temperature of the vacuum pressing machine is raised by a rising speed of 5° C./min and maintained to a temperature T3 (200° C.) for a period P3 of time. The temperature T3 cures the resin 311, and changes the prepreg sheet 11 into the cured board 161.

While the temperature in the vacuum pressing machine varies according to the profile Q1, the temperature of the prepreg sheet 11 changes according to a profile Q2. Throughout the periods P1 to P3, the laminated body 1002 is pressed by the pressure of 5 MPa so as to bond the metal foils 125A and 125B to the prepreg sheet 11.

Figure 3H:
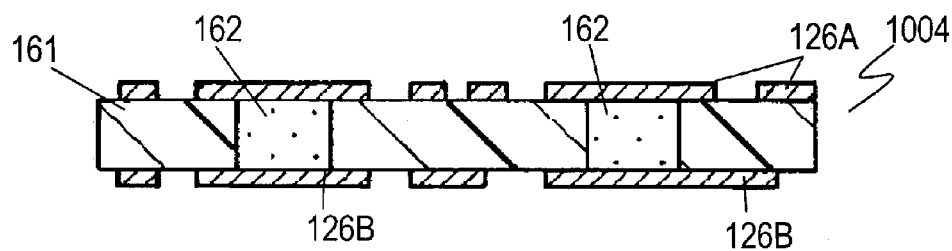
FIG. 3H is a cross sectional view of the circuit board for illustrating the method of manufacturing the circuit board according to the embodiment.

Then, as shown in FIG. 3H, the metal foils 125A and 125B of the circuit board 1003 are patterned by photolithographic etching to provide circuit wiring layers 126A and 126B, thus providing the circuit board 1004.

Samples Nos. 1 to 7, ten samples for of each sample number, of the laminated body 1002 were manufactured by the above method. Then, each sample of the laminated body 1002 was divided to prepare six samples of the circuit board 1003. Each sample of the circuit board 102 includes 500 via-conductors 162. Evaluation results of the via-conductors 162 are shown in FIG. 4. FIG. 4 shows the thickness $t_1$ of the prepreg sheet 11, respective thicknesses $t_{f1}$ and $t_{f2}$ of the organic films 12a and 12B, respective diameters $r_{f1}$ and $r_{f2}$ of the though-holes 112A and 112B, the minimum diameter $r_{min}$ of the though-hole 13, and the resistance between the metal foils 125a and 125B of each via-conductor 162. According to the embodiment, the resistance of the via-conductor 162 successfully formed is not greater than 10 mΩ. This resistance is qualified as a reference level for judging whether or not the via-conductor 162 is connected securely with the metal foil 125A and 126. FIG. 4 shows ratios R1 and R2 expressed by:

$$R1 = r_{f1}/t_{f1} = r_{f2}/t_{f2}$$

$$R2 = r_{min}/(t_1 + t_{f1} + t_{f2})$$

Samples 1, 3, 4, 5, and 7 have the resistances not greater than 10 mΩ, hence including the via-conductor 162 successfully formed and connected between the metal foils 125A and 125B. However, samples 2 and 6 have the resistance exceeding 10 mΩ, hence including the via-conductor 126 which is not connected reliably with the metal foils 125A and 125B.

Sample 2 have the resistance of several hundreds ohms, which is much greater than 10 mΩ. Sample 2 is identical to sample 1 in the thickness $t_1$ of the prepreg sheet 11, the minimum diameter $r_{min}$ of the though-hole 13, and the diameters $r_{f1}$, $r_{f2}$ of the though-holes 112A, 112B. However, sample 2 has the thicknesses $t_{f1}$ and $t_{f2}$ of the organic films 12A and 12B larger than those of sample 1. According to analysis of a polished cross section of the via-conductor 162 of sample 2, it was confirmed that the amount of the filling conductive paste 15 was not sufficient. Portions of the conductive paste were attached to the though holes 112A and 112B of the organic films 12A and 12B which have been removed off, thus providing a defective shown in FIG. 10C. Sample 2 has the ratio R1 smaller than 3, and produces the defective shown in FIG. 10C preventing the via-conductor 126 from being connected with the metal foils 125A and 125B.

The defective shown in FIG. 10C may be produced if the shear strength of the conductive paste 15 to the inner walls of the holes 125A and 125B in the organic films 25A and 25B is larger than the bulk strength of the conductive paste 15. If the ratio R1 of the diameters $r_{f1}$ and $r_{f2}$ of the though-holes 125A and 125B in the organic films 25A and 25B to the thicknesses $t_{f1}$ and $t_{f2}$ of the organic films 12A and 12B is not smaller than 3, the shear strength of the conductive paste 15 to the inner walls of the holes 125A and 125B in the organic films 25A and 25B is smaller than the bulk strength of the conductive paste 15, thus eliminating the defective shown in FIG. 10C.

Sample 6 has the resistance indicating that the via-conductor 126 is completely disconnected from the metal foils 125A and 125B. Sample 6, similar to samples 1 and 2, is identical to sample 7 in the thickness $t_1$ of the prepreg sheet 11, and the diameters $r_{f1}$, $r_{f2}$, and $r_{min}$ of the though-holes 112A, 112B, and 13. However, sample 7 has the thicknesses $t_{f1}$ and $t_{f2}$ of the organic films 12A and 12B different from those of sample 7. The thicknesses $t_{f1}$ and $t_{f2}$ of the organic films 12A and 12B of sample 7, a non-defective, are greater than those of Sample 6. According to analysis of a polished cross section of the via-conductor 162 of sample 6, it was confirmed that the though-hole 1001A was not filled with the conductive paste 15. More specifically, the conductive paste 15 having a size identical to that of the though-hole 1001A was attached onto the porous sheet 155 (FIG. 3C) used for filling the though-hole 1001A with the conductive paste 15. According to this result, if the ratio R2 is greater than 1.5, a defective shown in FIG. 11B may be produced, thus preventing the via-conductor 126 from filling.

Sample 3 having the ratio R1 of 3 and Sample 5 having the ratio R2 of 1.5 exhibited no defective and had the resistance not greater than 10 mΩ.

Figure 11A:
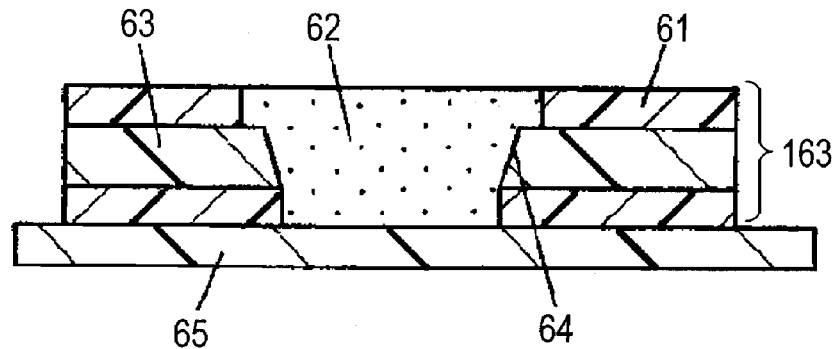
FIG. 11A is a cross sectional view of a further conventional circuit board for illustrating the method of manufacturing the board.
Figure 11B:
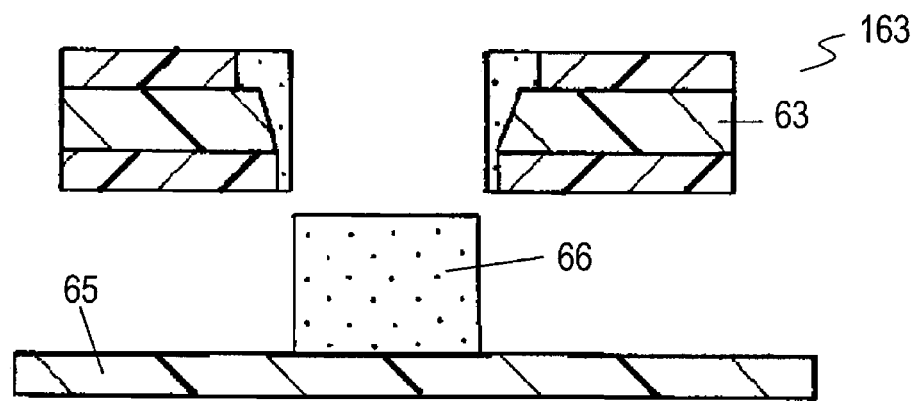
FIG. 11B is a cross sectional view of the further conventional circuit board for illustrating the method of manufacturing the board.
Figure 11C:
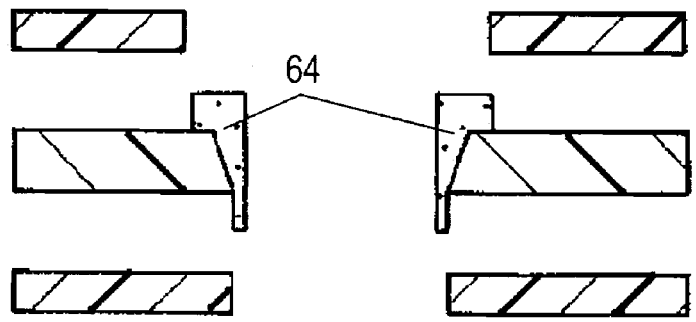
FIG. 11C is a cross sectional view of the further conventional circuit board for illustrating the method of manufacturing the board.

The defective shown in FIG. 11B may be produced if the bonding strength of the conductive paste 15 to the porous sheet 155 is larger than the bulk strength of the conductive paste 15. If the ratio R2 of the minimum diameter $r_{min}$ of the though-hole 13 to the thicknesses $t_0$ of the intermediate material 1001 is not greater than 1.5, the bonding strength of the conductive paste 15 to the porous sheet 155 becomes smaller than the bulk strength of the conductive paste 15, thus eliminating the defective shown in FIG. 11B.

According to the embodiment, the circuit board includes the prepreg sheet 11 having the thickness $t_1$ of 60 μm. According to the embodiment, the prepreg sheet 11 having the thickness $t_1$ of 80 μm, 100 μm, or 120 μm provides the same effects.

The via-conductors 162 may be formed by a method, such as though-hole technique, bump technique, or field plating technique, other than the method using the conductive paste 15. In the case that the via-conductor 162 is formed by the though-hole technique, the though-hole may preferably be filled with a resin or cover plated.

FIGS. 6A to 6D are cross sectional views of a multi-layer circuit board 1006 for illustrating a method of manufacturing the circuit board according to the embodiment.

Figure 6A:
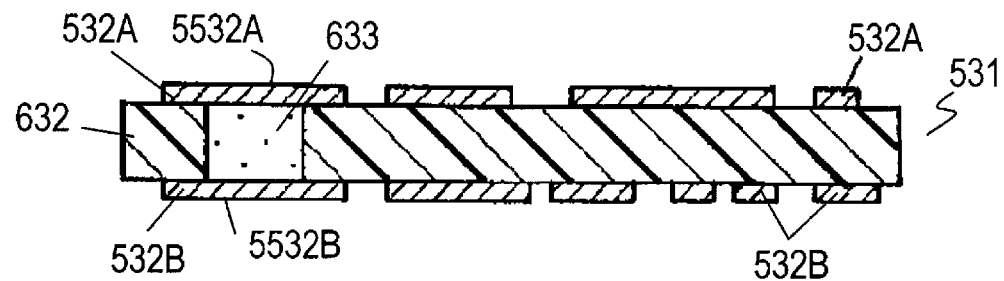
FIG. 6A is a cross sectional view of a multi-layer circuit board for illustrating a method of the board according to the embodiment.

FIG. 6A illustrates a core board 531, the circuit board 1004 manufactured by the method shown in FIGS. 3A to 3H. The core board 531 includes a cured board 632, a via-conductor 633, and circuit wiring layers 532A and 532B which are equivalent to the cured board 161, the via-conductor 162, and the circuit wiring layers 126A and 126B shown in FIG. 3H, respectively.

Figure 6B:
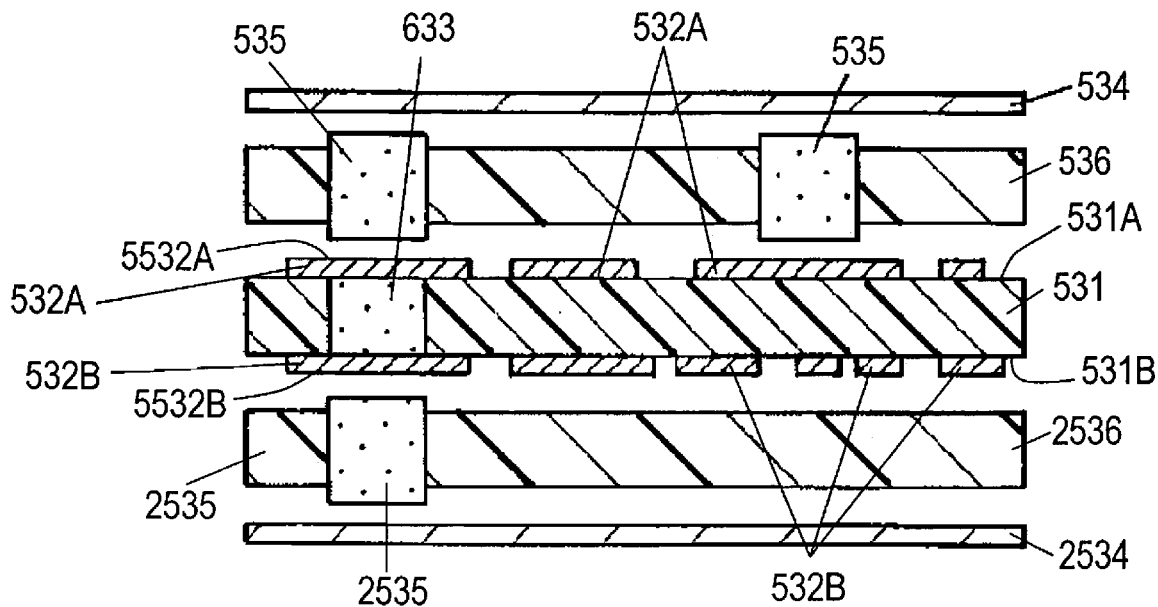
FIG. 6B is a cross sectional view of the multi-layer circuit board for illustrating the method of the board according to the embodiment.
Figure 6C:
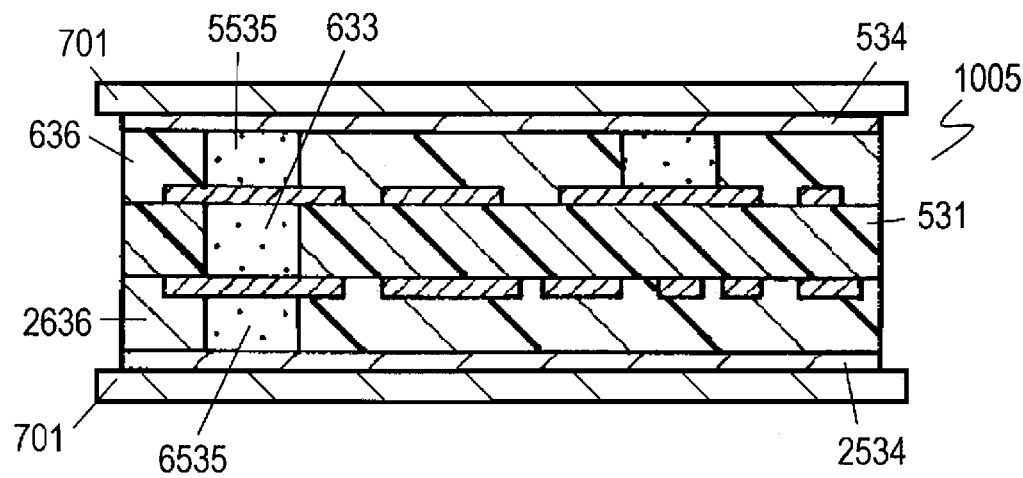
FIG. 6C is a cross sectional view of the multi-layer circuit board for illustrating the method of the board according to the embodiment.

As shown in FIG. 6B, a prepreg sheet 536 filled with a conductive paste 535 which is equivalent to the prepreg sheet 11 filled with the conductive paste 15 shown in FIG. 3E is positioned and placed on a surface 531A of the core board 531, while the conductive paste 535 contacts the circuit wiring layer 532A. A prepreg sheet 2536 filled with a conductive paste 2535 which is equivalent to the prepreg sheet 11 filled with the conductive paste 15 shown in FIG. 3E is positioned and placed on a surface 531B of the core board 531, while the conductive paste 2535 contacts the circuit wiring layer 532B. A copper foil 534 is placed on the prepreg sheet 536, and a copper foil 2534 is placed on the prepreg sheet 2536, thus providing a laminated body. This laminated body is sandwiched between two metal plates 701 and heat-pressed. This operation changes the prepreg sheets 536 and 2536 into cured boards 636 and 2636, respectively, and changes the conductive paste 535 and 2535 into via-conductors 5535 and 6535, thus providing a cured laminated body 1005 shown in FIG. 6C.

The thermal expansion coefficient (linear expansion coefficient) of the metal intermediate plate 701 may preferably be substantially equal to the thermal expansion coefficient (linear expansion coefficient) of the core board 531. This arrangement prevents the core board 531 from being injured during the heat-pressing of the laminated body. If the cured board 161 of the core board 531 is made of glass epoxy resin, the metal plate 701 is preferably made of SUS 304 or SUS 301 steel having the thermal expansion coefficient (linear expansion coefficient) identical to that of the glass epoxy resin.

Figure 6D:
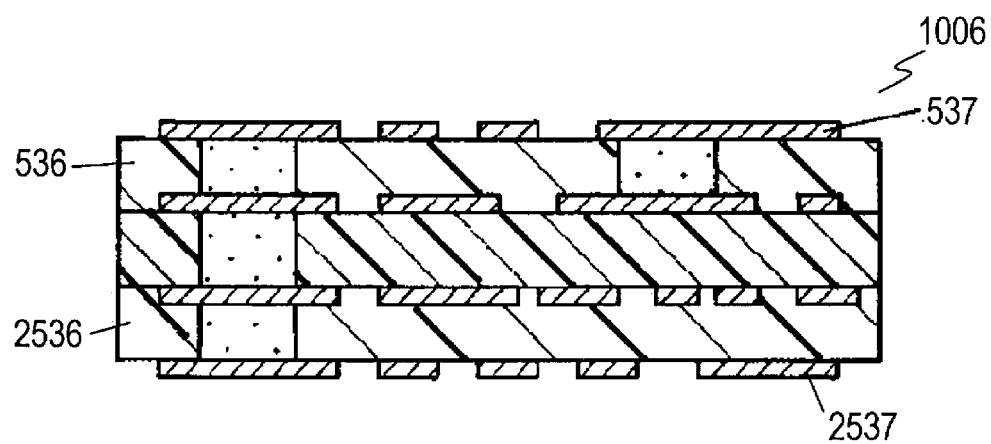
FIG. 6D is a cross sectional view of the multi-layer circuit board for illustrating the method of the board according to the embodiment.
Figure 7A:
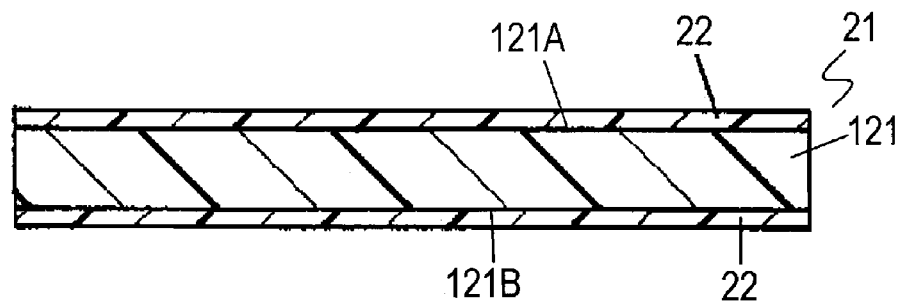
FIG. 7A is a cross sectional view of a conventional circuit board for illustrating a method of manufacturing the board.
Figure 7B:
FIG. 7B is a cross sectional view of the conventional circuit board for illustrating the method of manufacturing the board.
Figure 7C:
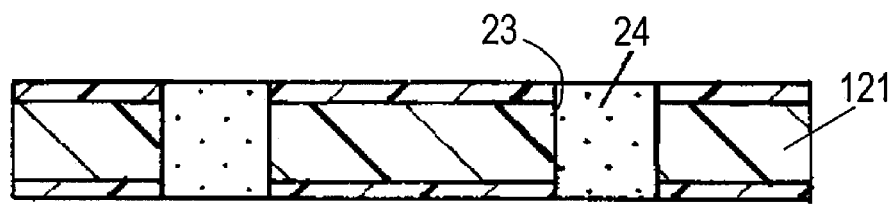
FIG. 7C is a cross sectional view of the conventional circuit board for illustrating the method of manufacturing the board.
Figure 7D:
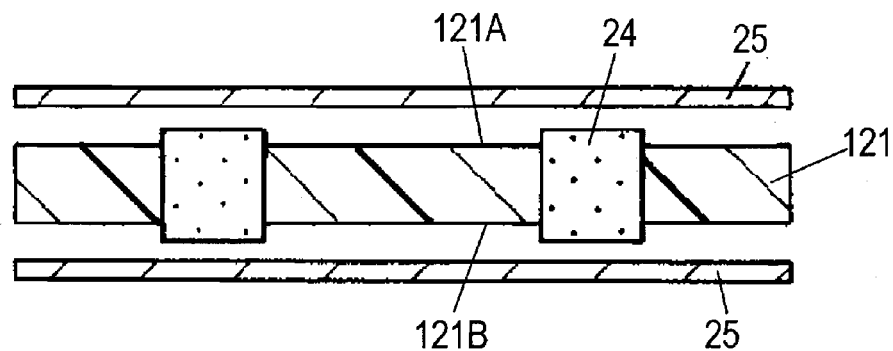
FIG. 7D is a cross sectional view of the conventional circuit board for illustrating the method of manufacturing the board.
Figure 7E:
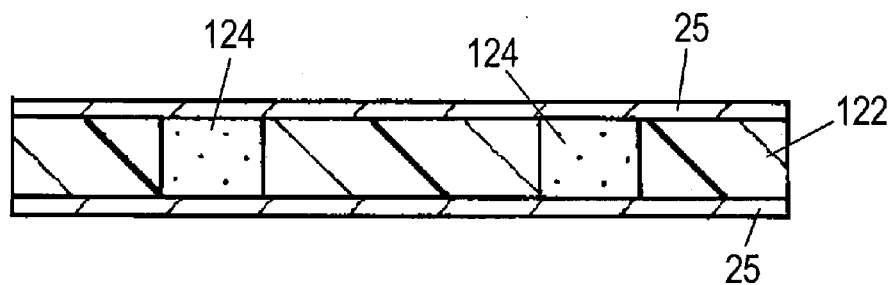
FIG. 7E is a cross sectional view of the conventional circuit board for illustrating the method of manufacturing the board.
Figure 7F:
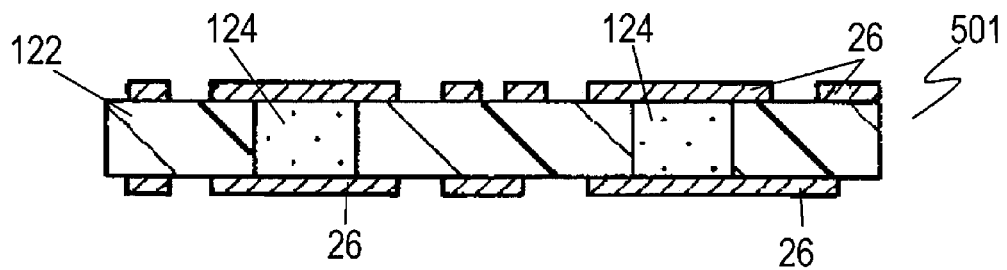
FIG. 7F is a cross sectional view of the conventional circuit board for illustrating the method of manufacturing the board.
Figure 8A:
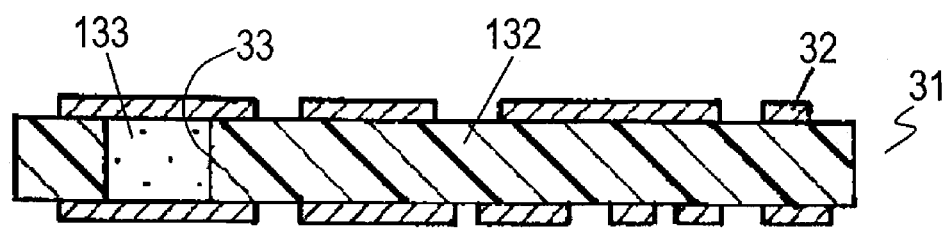
FIG. 8A is a cross sectional view of a conventional multi-layer circuit board for illustrating a method of manufacturing the board.
Figure 8B:
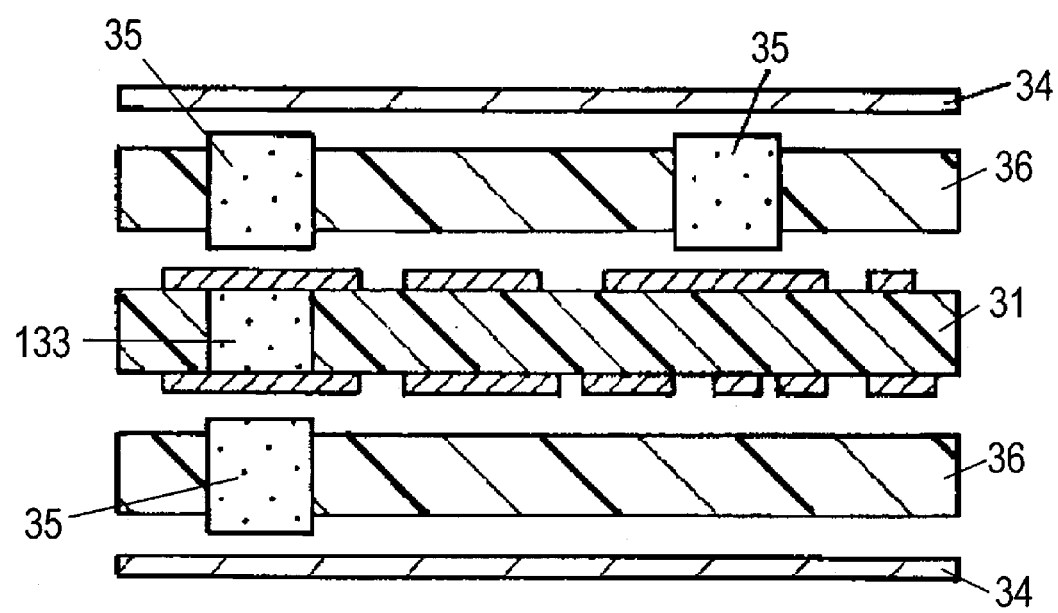
FIG. 8B is a cross sectional view of the conventional multi-layer circuit board for illustrating the method of manufacturing the board.
Figure 8C:
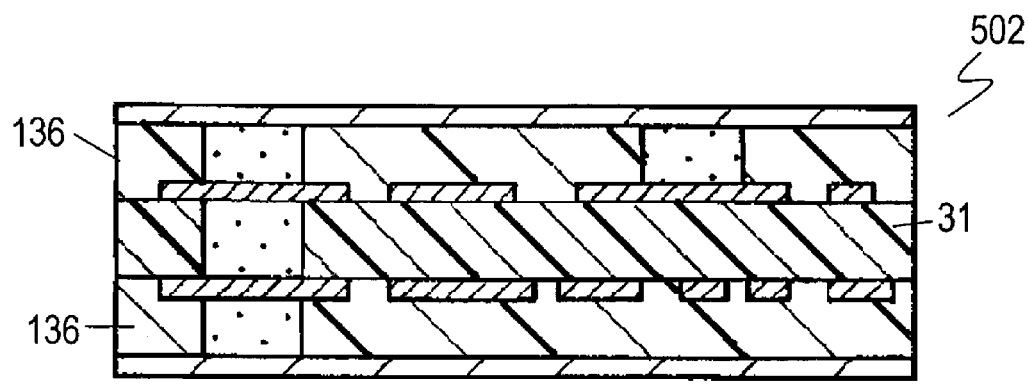
FIG. 8C is a cross sectional view of the conventional multi-layer circuit board for illustrating the method of manufacturing the board.
Figure 8D:
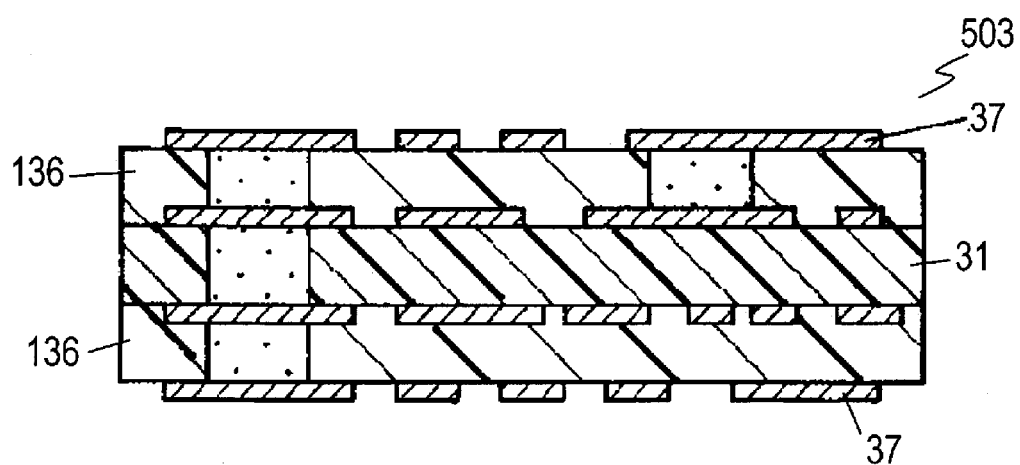
FIG. 8D is a cross sectional view of the conventional multi-layer circuit board for illustrating the method of manufacturing the board.
Figure 9A:
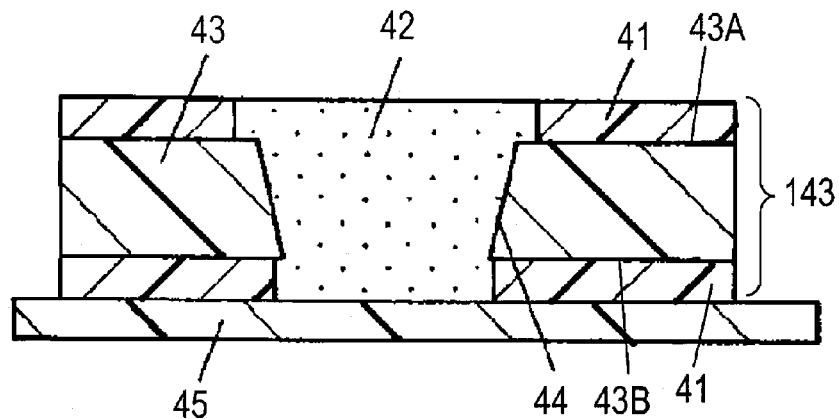
FIG. 9A is a cross sectional view of the conventional circuit board for illustrating the method of manufacturing the board.
Figure 9B:
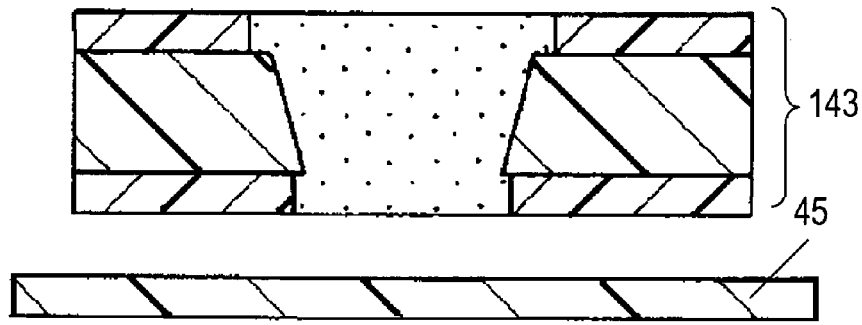
FIG. 9B is a cross sectional view of the conventional circuit board for illustrating the method of manufacturing the board.
Figure 9C:
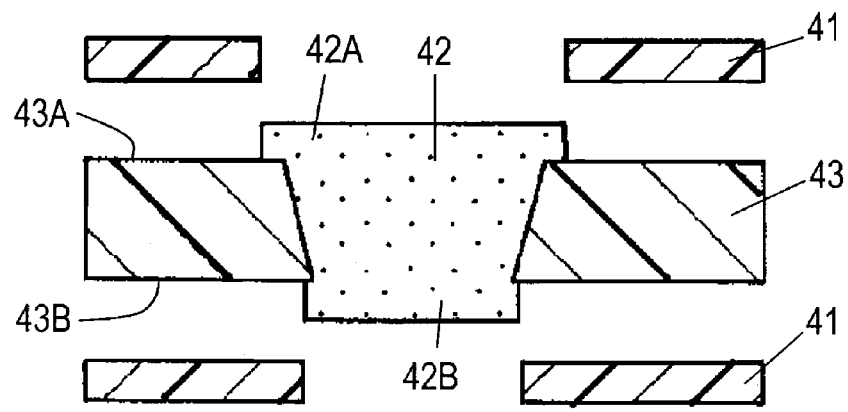
FIG. 9C is a cross sectional view of the conventional circuit board for illustrating the method of manufacturing the board.

Then, the copper foils 534 and 2534 are patterned by, for example, a photolithographic etching technique to provide circuit wiring layers 537 and 2537, thus providing the multi-layer circuit board 1006 shown in FIG. 6D. If required, the circuit wiring layers 537 and 2537 and the cured boards 536 and 2536 may be coated with solder resists. Alternatively, if necessary, the circuit wiring layers 537 and 2537 may be subject to surface treatment, such as plating.

The processes shown in FIGS. 6A to 6D may be repeated with the multi-layer circuit board 1006 used as the core board for manufacturing a multi-layer circuit board.

The surfaces 5532A and 5532B of the circuit wiring layers 532A and 532B of the core board 531 are preferably rough surfaces. The rough surfaces 5532A and 5532B may be provided by using the metal foils 534 and 2534 of surface roughed type or by roughening surfaces of the metal foils 534 and 2534 by a chemical polishing technique, such as CZ process, or a physical polishing technique, such as sand blasting. The rough surfaces 5532A and 5532B contact the conductive pastes 535 and 2535, i.e., the via-conductors 5535 and 6535, and allow the metal foils 534 and 2534 to be connected with the via-conductors 5535 and 6636 reliably and stably.

As described above, the intermediate material 1001 according to the embodiment provides the circuit board 1004 in which including the via-conductor 162 made of the conductive paste 15 is connected with the circuit wiring layers 126A and 125B reliably and stably.

The circuit board 1004 according to the embodiment provides a multi-layer circuit board suitable for high density mounting in which all layers are connected reliably with each other through the via-conductors.

INDUSTRIAL APPLICABILITY

An intermediate material according to the present invention provides a circuit board having a fine via-conductor connected to a metal foil securely and stably.

The invention claimed is:

1. A method of manufacturing a circuit board comprising:
providing a prepreg sheet having a first surface and a second surface opposite to the first surface, the prepreg sheet having a thickness $t_1$;
placing a first film on the first surface of the prepreg sheet, the first film having a thickness $t_{f1}$;
placing a second film on the second surface of the prepreg sheet, the second film having a thickness $t_{f2}$;
forming a through-hole in the prepreg sheet, a first hole in the first film, and a second hole in the second film, the through-hole communicating with the first surface and the second surface of the prepreg sheet, the though-hole having a minimum diameter $r_{min}$, the first hole communicating with the through-hole and having a diameter $r_{f1}$, the second hole communicating with the through-hole and having a diameter $r_{f2}$;
filling the though-hole, the first hole, and the second hole with a conductive paste;
peeling off the first film and the second film from the prepreg sheet such that the conductive paste protrudes from at least one of the first surface and the second surface of the prepreg sheet;
after said peeling off the first film and the second film, forming a laminated body by placing a first metal foil on the first surface of the prepreg sheet; and
curing the laminated body,
wherein the through-hole, the first hole, and the second hole satisfy a relation:

$r_{f1}/t_{f1} \geq 3$, $r_{f2}/t_{f2} \geq 3$, and $r_{min}/(t_1+t_{f1}+t_{f2}) \leq 1.5$, wherein the through-hole has a first opening in the first surface of the prepreg sheet and a second opening in the second surface of the prepreg sheet, and wherein the minimum diameter $r_{min}$ of the through-hole is smaller than a diameter of the first opening and smaller than a diameter of the second opening.

2. The method according to claim 1, wherein said curing the laminated body comprises:
heating the laminated body at a first temperature;
after said heating the laminated body at the first temperature, heating the laminated body at a second temperature higher than the first temperature; and
after said heating the laminated body at the second temperature, heating the laminated body at a third temperature higher than the second temperature.

3. The method according to claim 2, wherein
the prepreg sheet contains a resin, and
the first temperature is close to a softening point of the resin of the prepreg sheet.

4. The method according to claim 3, wherein the softening temperature of the resin of the prepreg sheet is lower than a reaction-starting temperature of the conductive paste.

5. The method according to claim 1, wherein said forming the laminated body comprises, after said peeling off the first film and the second film, providing a core board on the second surface of the prepreg sheet, and
wherein said curing the laminated body comprises:
(i) sandwiching the laminated body between metal plates; and
(ii) heating and pressing the laminated body sandwiched between the metal plates.

6. The method according to claim 5, wherein the metal plates have thermal expansion coefficients substantially equal to a thermal expansion coefficient of the core board.

7. The method according to claim 1, wherein a position of the minimum diameter $r_{min}$ of the through-hole is different from a position of the first opening and different from a position of the second opening.

8. The method according to claim 1, wherein the minimum diameter $r_{min}$ of the through-hole is located at a position between the first opening and the second opening.

9. The method according to claim 2, wherein the prepreg sheet contains a resin,
wherein the second temperature is higher than a reaction-starting temperature of the conductive paste and lower than a curing temperature of the resin such that said heating the laminated body at the second temperature cures the conductive paste but does not cure the resin, and
wherein said heating the laminated body at the third temperature cures the resin.

10. The method according to claim 1, wherein the thickness of the first film $t_{f1}$ is at least 5 µm and not greater than 30 µm, and
wherein the thickness of the second film $t_{f2}$ is at least 5 µm and not greater than 30 µm.

11. The method according to claim 1, wherein said forming the through-hole in the prepreg sheet, the first hole in the first film, and the second hole in the second film is performed with a laser.

12. The method according to claim 11, wherein said curing the laminated body comprises:
heating the laminated body at a first temperature;
after said heating the laminated body at the first temperature, heating the laminated body at a second temperature higher than the first temperature; and
after said heating the laminated body at the second temperature, heating the laminated body at a third temperature higher than the second temperature.

13. The method according to claim 12, wherein
the prepreg sheet contains a resin, and
the first temperature is close to a softening point of the resin of the prepreg sheet.

14. The method according to claim 13, wherein the softening temperature of the resin of the prepreg sheet is lower than a reaction-starting temperature of the conductive paste.

15. The method according to claim 11, wherein said forming the laminated body comprises, after said peeling off the first film and the second film, providing a core board on the second surface of the prepreg sheet, and
wherein said curing the laminated body comprises:
(i) sandwiching the laminated body between metal plates; and
(ii) heating and pressing the laminated body sandwiched between the metal plates.

16. The method according to claim 15, wherein the metal plates have thermal expansion coefficients substantially equal to a thermal expansion coefficient of the core board.

17. The method according to claim 11, wherein a position of the minimum diameter $r_{min}$ of the through-hole is different from a position of the first opening and different from a position of the second opening.

18. The method according to claim 11, wherein the minimum diameter $r_{min}$ of the through-hole is located at a position between the first opening and the second opening.

19. The method according to claim 12, wherein the prepreg sheet contains a resin,
wherein the second temperature is higher than a reaction-starting temperature of the conductive paste and lower than a curing temperature of the resin such that said heating the laminated body at the second temperature cures the conductive paste but does not cure the resin, and
wherein said heating the laminated body at the third temperature cures the resin.

20. The method according to claim 11, wherein the thickness of the first film $t_{f1}$ is at least 5 μm and not greater than 30 μm, and
wherein the thickness of the second film $t_{f2}$ is at least 5 μm and not greater than 30 μm.

* * * * *